(12) United States Patent
Johannes

(10) Patent No.: US 9,078,368 B2
(45) Date of Patent: Jul. 7, 2015

(54) CROSS-JUMP SUPPORTING I/O MODULE AND ELECTRICAL CONTACT ELEMENT

(75) Inventor: Matthias Johannes, Bad Pyrmont-Thal (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 313 days.

(21) Appl. No.: 13/594,241

(22) Filed: Aug. 24, 2012

(65) Prior Publication Data

US 2014/0055935 A1 Feb. 27, 2014

(30) Foreign Application Priority Data

Aug. 24, 2012 (DE) .......................... 10 2011 052 964

(51) Int. Cl.
*H01R 9/26* (2006.01)
*H05K 7/14* (2006.01)
*H01R 13/11* (2006.01)

(52) U.S. Cl.
CPC ................ *H05K 7/14* (2013.01); *H01R 9/2675* (2013.01); *H01R 13/113* (2013.01)

(58) Field of Classification Search
CPC ...... H01R 9/2408; H01R 13/514; H01R 9/26; H01R 9/2608
USPC .......................................................... 439/717
See application file for complete search history.

(56) References Cited

U.S. PATENT DOCUMENTS

| 4,322,120 A * | 3/1982 | Rilling ........................ 439/631 |
| 4,552,425 A | 11/1985 | Billman |
| 5,314,350 A * | 5/1994 | Matthews et al. ............. 439/404 |
| 5,545,060 A * | 8/1996 | Gow .............................. 439/717 |
| 6,033,264 A | 3/2000 | Feye-Hohmann |
| 6,172,877 B1 | 1/2001 | Feye-Hohmann |
| 6,332,811 B1 * | 12/2001 | Sato .............................. 439/701 |
| 6,358,098 B1 * | 3/2002 | Wakata ......................... 439/701 |
| 6,537,080 B2 * | 3/2003 | Sato ................................ 439/43 |

(Continued)

FOREIGN PATENT DOCUMENTS

| DE | 43 24 061 | 1/1995 |
| DE | 44 02 002 | 7/1995 |
| DE | 197 18 996 | 6/1998 |

(Continued)

OTHER PUBLICATIONS

English Language Machine Translation of Abstract and claims of DE 44 02 002 published Jul. 20, 1995.

(Continued)

*Primary Examiner* — Gary Paumen
(74) *Attorney, Agent, or Firm* — DLA Piper LLP (US)

(57) ABSTRACT

Implementations herein relate to an input/output (I/O) module which can be grouped to form several modules next to each other on a mounting rail, and which can be electrically connected to each other by means of blade/fork contacts. The blade contact element and the fork contact element of the blade/fork contact are designed in such a manner that it is not necessary to group the modules before the assembly on the mounting rail. Instead, subsequent I/O modules can be added to the top or the side of the existing group. Similarly, it is possible to take out or replace individual modules subsequently. Further implementations relate to electrical contact elements for achieving cross jumping between I/O modules. Here, for example, such electrical contact element may be designed as a combined blade-fork contact element.

22 Claims, 8 Drawing Sheets

(56) References Cited

U.S. PATENT DOCUMENTS 6,692,292 B2 * 2/2004 Huiskamp et al. ............ 439/417
6,851,985 B2 * 2/2005 Lafragette et al. ............ 439/701

FOREIGN PATENT DOCUMENTS

DE         197 10 768        9/1998
DE   20 2010 006 065    9/2010

OTHER PUBLICATIONS

English Language Machine Translation of DE 20 2010 006 065 published Sep. 9, 2010.
Enlgish Language Abstract of DE 43 24 061 published Jan. 19, 1995.
English Language Abstract of De197 10 768 published Sep. 24, 1998.
English Language Abstract of DE 197 18 996 published Jun. 4, 1998.

* cited by examiner

CROSS-JUMP SUPPORTING I/O MODULE AND ELECTRICAL CONTACT ELEMENT

CROSS REFERENCE TO RELATED APPLICATION INFORMATION

This application claims benefit/priority of German patent application No. 10 2011 052 964, filed Aug. 24, 2011, which is incorporated herein by reference in entirety.

BACKGROUND

1. Field

The inventions herein relate in general to automation technology.

2. Description of Related Information

In automation technology, for the construction of control equipment of different manufacturers, appropriate I/O modules of a great variety are offered, from which, as with a construction kit, different components can be selected and mutually combined for the given control problem to be solved. The construction of corresponding control units occurs in switching cabinets, within which the I/O modules are usually arranged next to each other on transversely extending rails. Here, the transversely extending and standardized rails, also referred to as mounting rails, provide only a mechanical attachment function. The electrical linking of the I/O modules to each other occurs by individual single wiring or also by BUS systems, as is known from DE 44 02 002 B4.

The establishment of the individual single wiring represents a time consuming and error prone task which is carried out manually and in a time consuming manner by an electrician.

To reduce the installation effort, several approaches are known from the prior art, in order to route the power supply or signal lines required by several I/O modules in the same way, in the sense of a BUS system or a mutual cross-jumpering, by means of corresponding contacting systems from I/O module to I/O module.

In DE 44 02 002 B4, an I/O module is described, which can produce, via side wall contacts in the side surfaces, an electrical cross connection with the directly adjacent modules. The side contacts here are designed as pressure contacts which at all times tend to press the modules apart sideways. This is opposed, by holding together a group of mutually contacting modules, by means of end angles mounted on the support rail, or alternatively by the fact that the individual modules have corresponding hook-shaped projections and recesses on their side surfaces, which mutually engage at the time of the assembly of the modules and in this manner mechanically prevent moving apart.

DE 20 2010 006 065 U1 describes an I/O module in which cross-jumpering via a fork contact occurs. The bottom side of the module housing for this purpose has a groove which allows the introduction of a blade contact of an adjacent I/O module, so that the introduction of the blade contact of the adjacent module from below through the groove into the fork contact of the I/O module is made possible. Here, the fork contact is closed by the sideways mutual insertion of the I/O modules in the assembly direction (direction of the normal of the mounting rail), so that the arrangement m is substantially free of transverse forces in the axis along the mounting rail.

In comparison to DE 44 02 002 B4, in DE 20 2010 006 065 U1 no or at least clearly lower resilient forces pushing the module packet apart occur. However, as a result it is not possible to detach a single module from a module group mounted on the mounting rail. Rather, the module described in DE 20 2010 006 065 U1 requires a grouping of the modules before the assembly on the mounting rail or before disassembly of the entire group to replace an individual module.

DESCRIPTION OF THE DRAWINGS

The accompanying drawings, which constitute a part of this specification, illustrate various implementations and aspects of the present invention and, together with the description, explain the principles of the invention. In the drawings.

DETAILED DESCRIPTION OF ILLUSTRATIVE IMPLEMENTATIONS

Figure 1:
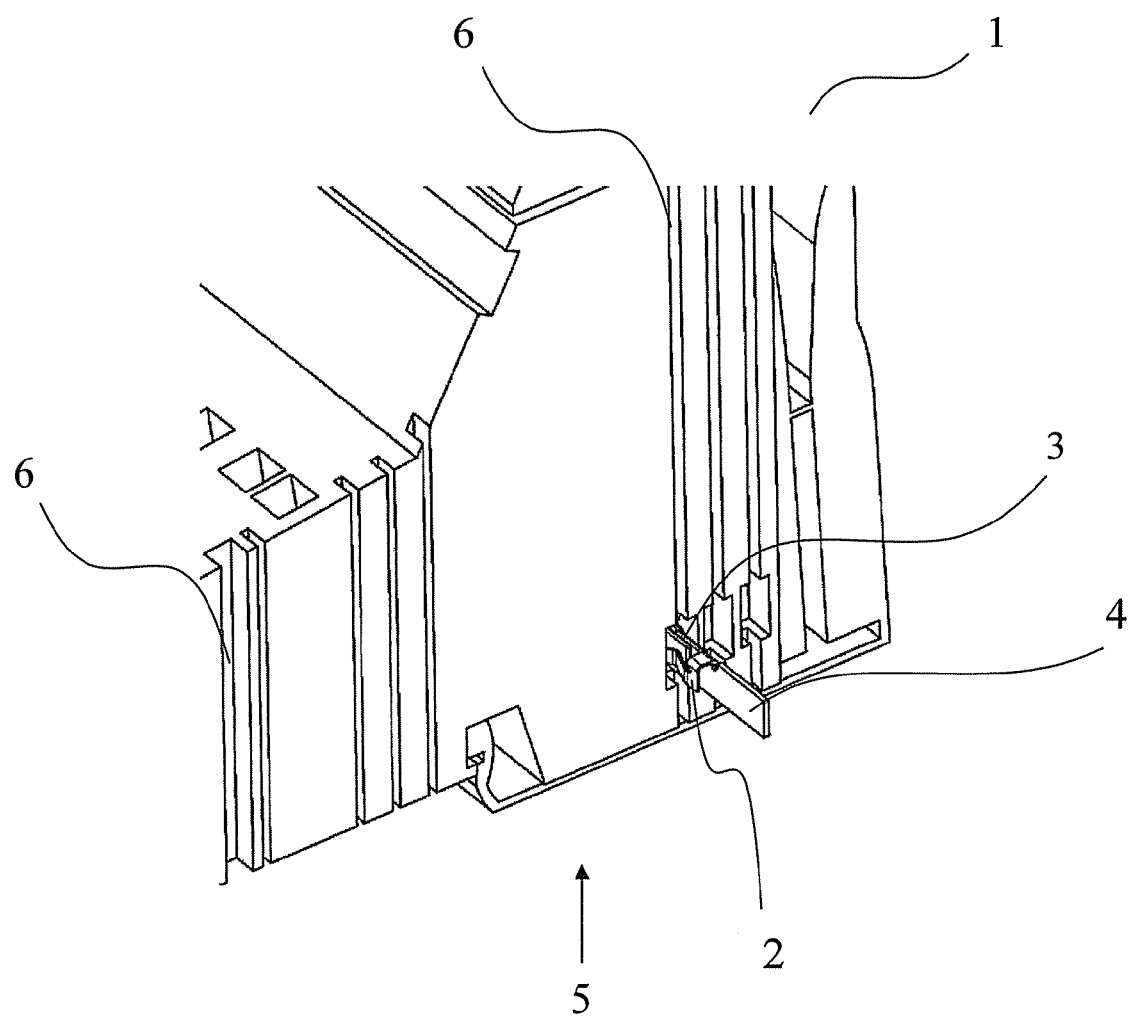
FIG. 1 shows a cut-out of the I/O module according to a preferred embodiment of the invention

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

The invention relates to an I/O module for assembly on a mounting rail, wherein the I/O module is mountable on the side next to another I/O module of its type on a mounting rail, and contactable to the other I/O module on the side to achieve cross-jumpering over a blade/fork contact. The invention further relates to an electrical contact element which is designed as a combined blade-fork contact element, to achieve cross-jumpering between I/O modules.

The invention is based on the problem of indicating an I/O module which can be grouped in a manner so it is free of transverse forces, and which additionally also allows an exchange of individual I/O modules of a group, without having to disassemble the entire group. An additional problem of the invention is to indicate an electrical contact element which is suitable for achieving cross-jumpering between I/O modules.

The problem is solved according to the invention by the characteristics of the independent claims. Advantageous embodiments of the invention are indicated in the dependent claims.

According to the invention, an electrical I/O module is provided for this reason for assembly on a mounting rail, wherein the I/O module is mountable on the side next to another I/O module of its type on a mounting rail, and contactable to the other I/O module on the side to achieve cross-jumpering over a blade/fork contact, characterized in that the blade/fork contact is to be opened or closed by moving the I/O module both in the axis of the normal of the mounting rail and also in the longitudinal axis of the mounting rail.

In other words, a solution is proposed wherein individual I/O modules are electrically cross connectable with each other by blade/fork contacts, wherein it is not necessary to group the modules before the assembly on the mounting rail; instead, in said solution, an additional module to be mounted can either be clipped from above next to an already mounted module on the mounting rail, or it can be contacted with said already mounted module by being shifted sideways on the mounting rail.

For the reverse process, during the disassembly or the replacement of a module, this means that the entire group does not have to be removed from the mounting rail, instead, by shifting the module on the mounting notes, the blade and fork contact element can be separated apart, and in this manner an individual module can be removed from the rail.

Thus, the invention presents both the advantage of accessibility of individual modules and also the advantage of an arrangement that is mechanically tension-free in the transverse direction.

The I/O module is preferably provided alternately with a blade or with a fork contact element, that is, on one side with a blade contact, and on the other side with a fork contact, so that several modules of this type can be arranged next to each other sequentially, without additional contacting efforts, power supply, or signal lines.

At least one of the contact elements of the blade/fork contact is also arranged advantageously within the base of the module, i.e., at least one contact element of the blade-fork contact is arranged so that the outer dimensions, particularly the mounting width of the module, are not increased by protruding contact elements.

Moreover, the at least one contact element of the blade/fork contact is located with protection inside the housing of the I/O module, and it is accessible through a housing opening.

The contact element is also arranged advantageously on an edge of the module, so that it is accessible from the two surfaces that form the edge. In this manner, the fork contact element can be arranged, for example, in such a manner on the bottom right housing edge that it is accessible for a corresponding blade contact element both from the bottom and also from the right.

Here, a fork contact, which is arranged on a bottom edge, and accessible via a housing groove, for example, offers the advantage that, in the case of successive assembly of the modules, the fork contact can be pushed onto a blade contact protruding out of the adjacent module, or, in other words, it can be slipped over the blade contact.

In the same manner, a design with a fork contact, for example on the top right housing edge, is possible, wherein a blade contact of an adjacent module mounted on the right next to the I/O module can be inserted from above or from the side into the fork contact.

However, the housing can also have a side recess which makes it possible to first introduce a blade contact from the side, and then push it in another direction into the fork contact.

In the same manner, the blade contact can be arranged in the base of the I/O module, and interact in a manner similar to the one described above, with a fork contact protruding out of the adjacent module.

In an additional advantageous embodiment of the invention, the blade or fork contact is accessible from three sides of the module, from the top, from below, and from a side. The advantage of such an arrangement is that for the subsequent assembly or for a disassembly of an I/O module, for example, from a group of I/O modules, continuing on both sides, no shifting of other modules into a slot that is just sufficiently broad in the switching cabinet is required, because the blade or fork contact of the adjacent module, which protrudes into the appropriate slot, can be introduced or retracted from or toward the back. In the same manner, the appropriate module blade or fork which protrudes into the adjacent slot, in the I/O module designed in same manner, can there be retracted toward the top (disassembly) or introduced from above (assembly).

In the case where the contacts are arranged in the interior of the housing, a groove which extends preferably over a side surface, and which is accessible both from the top and also from the bottom, allows the insertion of the contacts.

In an additional embodiment, the I/O modules can be designed on both sides with fork contacts lying on the inside. This embodiment has the advantage that no contacts protrude into the slots of the adjacent modules. This is advantageous if very little space is available, or if, at the end a group, no contacts should protrude out of the outermost I/O module.

Here, I/O modules that are provided on the both sides with fork contacts can be mutually contacted in a simple manner with double-sided blade contacts.

In an advantageous embodiment, the blade and/or fork contacts are designed as punched/bent element. Here, the punched/bent elements can be brought into a U-shaped shape, wherein the two arms of the "U" form a fork contact with mutual resilience. Moreover, the blade contact element as well as the fork contact element is preferably designed symmetrically, which has, on the one hand, the advantage that the same punched part can be used for the two contact elements, and, on the other hand, the advantage that the blade and fork contact elements in each case can take over the function of the counter element, so that a fork contact element at the same time can fulfill the function of a blade contact element, and a blade contact element can at the same time fulfill the function of the fork contact element.

Advantageously, an arm of the punched/bent element which has been bent to the shape of a U is designed linearly as a blade contact element, and the other arm of the punched/bent element which has been bent to the shape of a U has a curved design for the resilient reception of a blade contact. Formulated differently, one prong of the fork contact element is designed as a blade contact element, and in this manner a blade-fork contact element is produced.

Due to the alternating mutual engagement of the blades of the blade-fork contact elements into the respective fork of the corresponding blade-fork contact element, the contact reliability of the connection is increased additionally.

The resilient forces required for a reliable contacting act primarily within the fork contacts, so that adjacent I/O modules are not pushed apart by contact resilient forces, as is the case, for example, with sideways pressure contacts.

The design of the contact elements, which is open on the side, allows an opening and closing of the blade-fork contact in different directions of the plane of the blade contact element with flat design, so that an opening and closing of the contacts both in the axis of the normal of the mounting rail and also in the longitudinal axis of the mounting rail becomes possible.

To support an easy insertion of the blade contact elements into the fork contact elements, the latter are preferably bevelled on the side.

The invention further provides for this reason an electrical contact element which is characterized in that it is designed as a combined blade-fork contact element, wherein the combined blade-fork contact element has both a fork contact element comprising at least two prongs and also a blade contact element, and at least one of the prongs is usable as a blade contact element.

Here, a prong of the fork contact element is preferably designed linearly as a blade contact element.

Moreover, the electrical contact element is preferably produced by a punching-bending process, preferably from a flexible metal, wherein the fork contact element can be manufactured in such a manner that, for the formation of a first prong, no bending process is required after the punching process, and a second prong can be formed after the punching process by a bending process in such a manner that the second prong is bent in a bending direction by a bending angle of approximately 180° in axes parallel to the longitudinal axis of the first prong.

Here, the electrical contact element is preferably designed so that, with an electrical contact element of identical design, which can be manufactured only in the reverse bending direction, a blade-fork double contact can be manufactured, in which the blade contact elements and the fork contact elements of the combined blade-fork contacts can mutually engage.

To optimize the contacting, the prongs of the fork contact elements can preferably be designed multiply and/or the contact areas of the fork contact elements and/or blade contact elements can be designed with contour embossing.

Below, the invention is explained in further detail in reference to the appended drawing using preferred embodiments.

FIG. 1 shows a cut-out of an I/O mogul according to a preferred embodiment of the invention. The representation shows the bottom right corner of an I/O module 1 according to the invention, which has several blade/fork contacts 2 on the side. Shown therein is a blade-fork contact element 3 which lies inside of the envelope of the housing, and thus does not protrude out of the side surface of the I/O module.

On this blade-fork contact element 3, a blade-fork contact element 4 of an adjacent module is slid, which illustrates the mode of operation of the invention. The blade/fork contact 2—shown in closed position—can be opened in three directions: downward in the direction of the bottom side 5 of the I/O module, upward in the direction of the top side of the module, as well as to the side, sideways out of the side surface of the I/o module.

Figure 2:
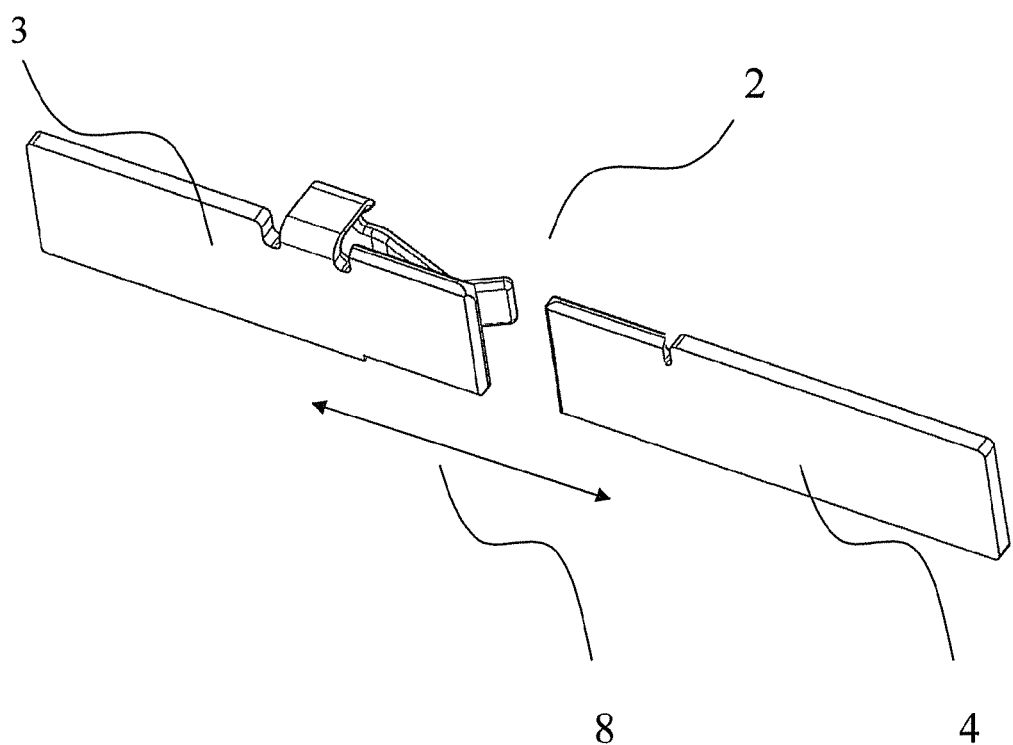
FIG. 2 shows a preferred embodiment of the blade/fork contact during closure in the longitudinal axis

FIG. 2 shows a fork contact element 3 and a blade contact element 4, each designed as a punched/bent element. The blade/fork contact can be opened or closed in the axis of the contact elements, which preferably corresponds to the longitudinal axis of the mounting rail 8.

Figure 3:
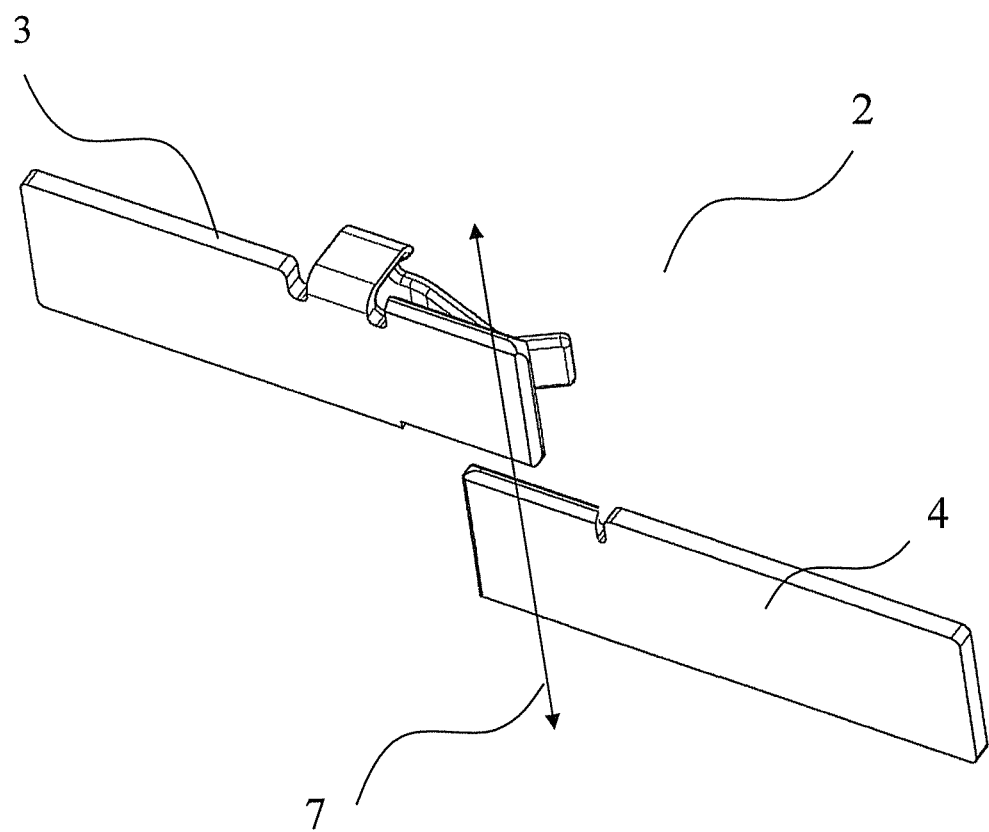
FIG. 3 shows a preferred embodiment of the blade/fork contact during closure transversely to the longitudinal axis

FIG. 3 also shows a fork contact element 3 and a blade contact element 4, each designed as a punched/bent element. In contrast to FIG. 2, what is shown here is that, due to the sideways open design of the fork contact, an opening and closing in the lateral direction can also occur, direction which preferably corresponds to the axis of the normal of the mounting rail.

Figure 4:
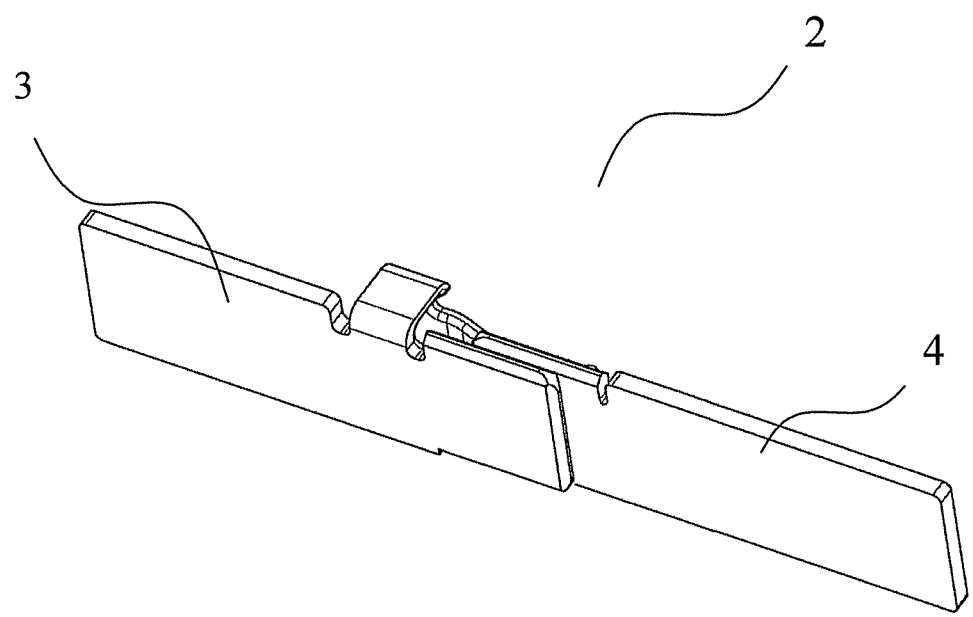
FIG. 4 shows a preferred embodiment of the blade/fork contact in the contacted state

FIG. 4 shows the blade/fork contact 2 in the closed or contacted state. Once in the closed state, no resilient forces occur in the direction of the longitudinal axis of the contact elements.

Figure 5:
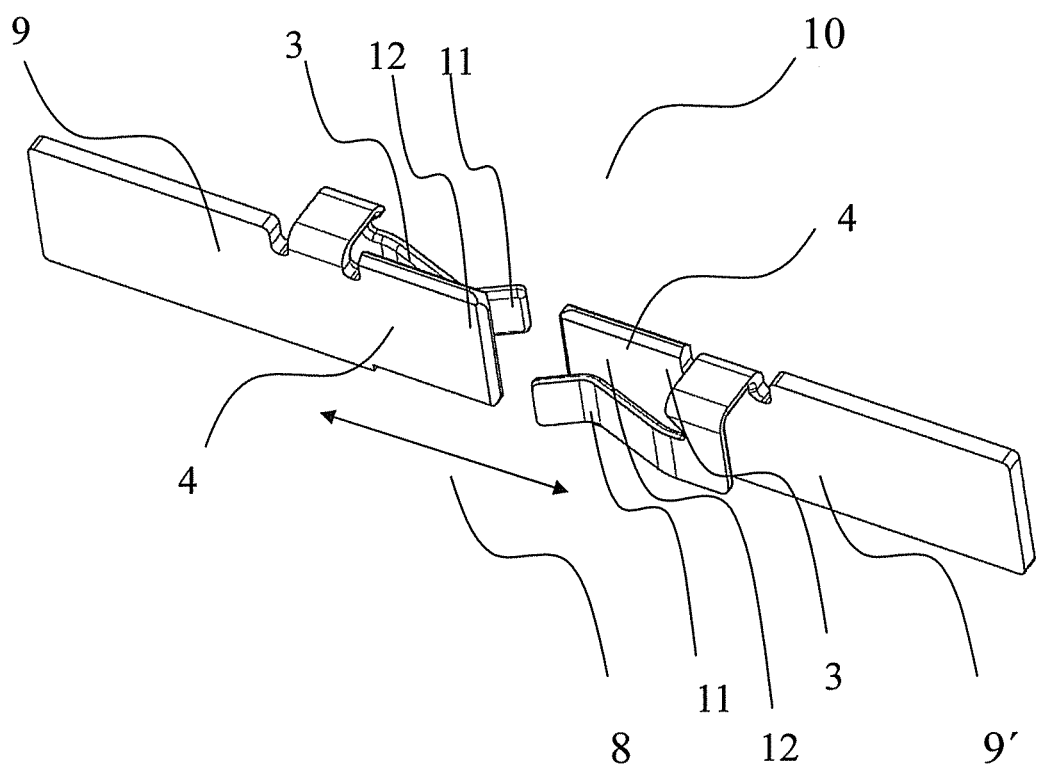
FIG. 5 shows a preferred embodiment of the blade/fork double contact during closure in the longitudinal axis

FIG. 5 shows a combined blade-fork contact element 9 and 9', each designed as a punched/bent element. Here, the two elements have the same punched shape before the bending process. The two contact elements have a flat blade contact designed linearly as a first prong of a fork contact. The different bending direction of the second prong designed as a leaf spring distinguishes the first combined blade-fork contact element 9 from the second combined blade-fork contact element 9'. The blade/fork double contact 10 can be opened or closed in the axis of the contact elements, which preferably corresponds to the longitudinal axis of the mounting rail 8.

Figure 6:
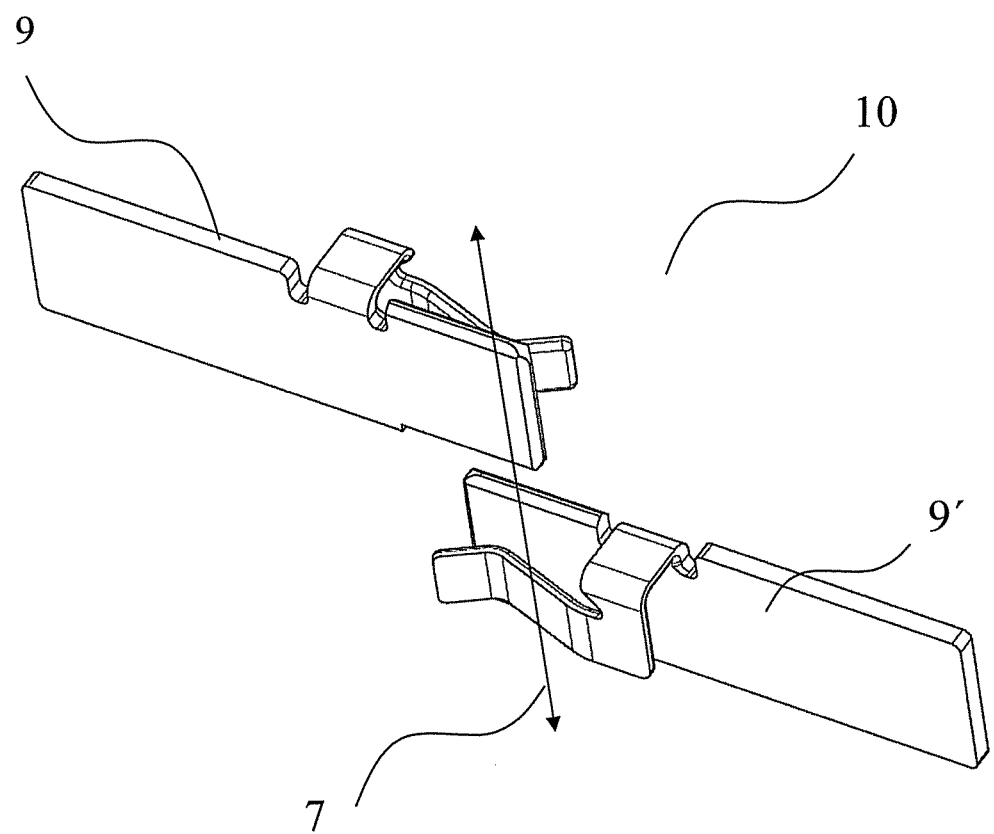
FIG. 6 shows a preferred embodiment of the blade/fork double contact during closure transversely to the longitudinal axis

FIG. 6 also shows a combined blade-fork contact element 9 and 9', each designed as a punched/bent element. In contrast to FIG. 5, what is shown here is that, due to the sideways open design of the fork contacts, an opening and closing in the lateral direction can also occur, direction which preferably corresponds to the axis of the normal of the mounting rail.

Figure 7:
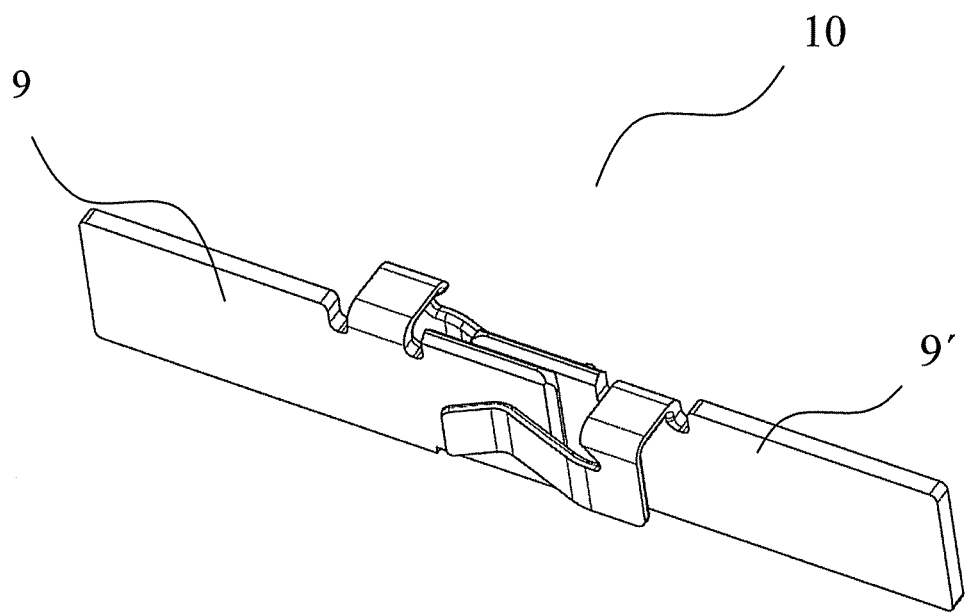
FIG. 7 shows a preferred embodiment of the blade/fork double contact in the contacted state with mutually engaging fork contacts.

FIG. 7 shows the blade/fork double contact 10 in the closed state, which illustrates the mutual engagement of the fork contacts. Once in the closed state, no resilient forces in the direction of the longitudinal axis of the contact elements occur.

Figure 8:
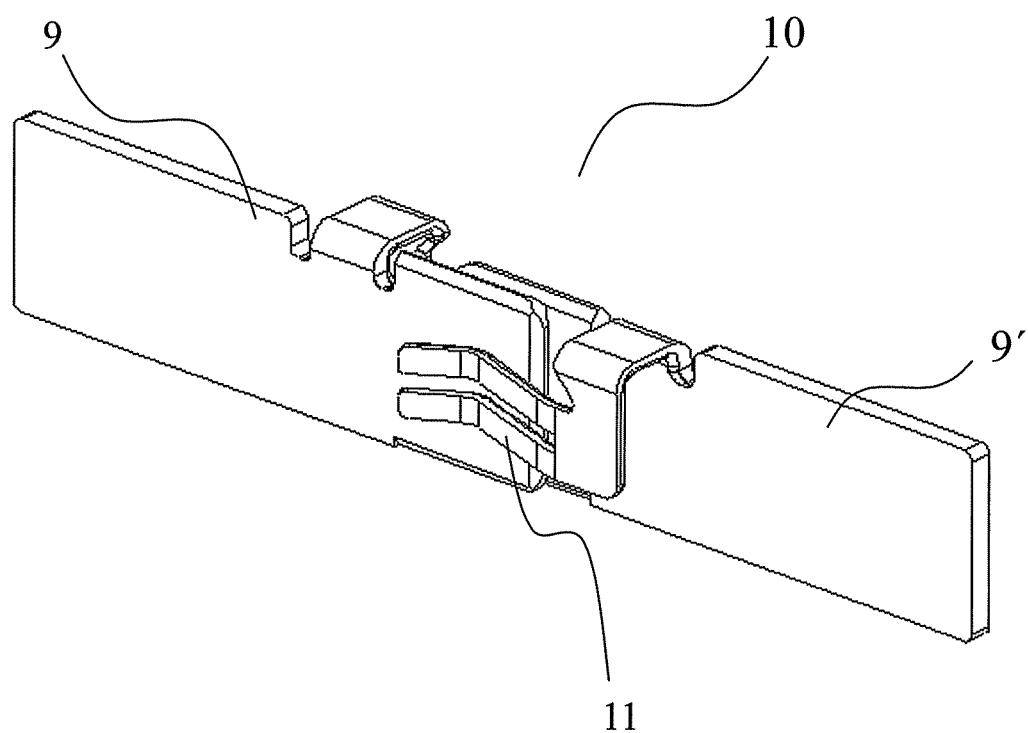
FIG. 8 shows a preferred embodiment of the blade/fork contact with prongs of a fork contact which have a sequential or a double design.

FIG. 8 shows similarly to FIG. 4 the blade/fork contact 2 in the closed state, wherein the prong with resilient design is represented split, which leads to an increase in the number of contact points and thus to an improvement of the contact reliability.

LIST OF REFERENCE NUMERALS

I/O module 1
Blade/fork contact 2
Fork contact element 3
Blade contact element 4
Bottom side 5
Groove 6
Axis of the normal of the mounting rail 7
Longitudinal axis of the mounting rail 8
Electrical contact element,
combined blade-fork contact element 9, 9'
Blade/fork double contact 10
Prong of a fork contact element 11, 12
Prong of a fork contact element and of a blade contact element 12

The invention claimed is:

1. An electrical input/output (I/O) module for assembly on a mounting rail, wherein the I/O module is mountable on a side next to another I/O module of a same type on the mounting rail, and the I/O module is contactable with the other I/O module on the side to achieve cross-jumping over a blade/fork contact,
    wherein the blade/fork contact is configured to be opened or closed by moving the I/O module both in the axis of the normal of the mounting rail and also in the longitudinal axis of the mounting rail.

2. The electrical I/O module according to claim 1, wherein the blade/fork contact comprises a blade contact element and a fork contact element, and the I/O module comprises at least one of the contact elements.

3. The electrical I/O module according to claim 1, wherein the blade/fork contact comprises a blade contact element and a fork contact element, and the I/O module alternately comprises a blade contact element and a fork contact element.

4. The electrical I/O module according to claim 1, wherein the blade and/or fork contact element lies within a base of the I/O module.

5. The electrical I/O module according to claim 1, wherein the blade and/or fork contact element is arranged to be accessible from a bottom side of the I/O module.

6. The electrical I/O module according to claim 1, wherein the blade and/or fork contact element is arranged to be accessible from a top side of the I/O module.

7. The electrical I/O module according to claim 1, wherein the blade and/or fork contact element is arranged to be accessible from a top side and from a bottom side of the I/O module.

8. The electrical I/O module according to claim 1, wherein a side wall of the module has a recess which allows an engagement of a blade and/or fork contact element of the other I/O module.

9. The electrical I/O module according to claim 1, wherein the blade and/or fork contact element lies in an envelope of a housing of the I/O module, and is accessible via a groove that is open toward a top and toward a bottom of the housing.

10. The electrical I/O module according to claim 1, wherein the I/O module comprises fork contact elements on two sides of the I/O module, and the fork contact elements are configured to accept double-sided blade contact elements inserted into the fork contact elements.

11. An electrical contact element, cross-jumping between I/O modules according to claim 1, being designed as a combined blade-fork contact element, wherein the combined blade-fork contact element comprises both a fork contact element comprising at least two prongs and a blade contact element, and at least one of the prongs is arranged to be usable as a blade contact element.

12. The electrical contact element according to claim 11, wherein a prong of the fork contact element is a linear blade contact.

13. The electrical contact element according to claim 11, wherein the electrical contact element is manufactured by a punching-bending process from a flexible metal, wherein a first Prong of the fork contact element is manufactured in such a manner that no bending process is required after the punching process, and wherein a second prong of the fork contact element is formed after the punching process by a bending process in such a manner that the second prong is bent in a bending direction at a bending angle of approximately 180° in axes parallel to the longitudinal axis of the first prong.

14. The electrical contact element according to claim 13, wherein a blade-fork double contact is manufactured, the blade-fork double contact comprising the blade-fork contact element and an electrical contact element of identical design, which is manufacturable only in a reverse bending direction, such that the blade contact elements and the fork contact elements of the blade-fork contact element and the identical contact element of the combined blade-fork contacts can mutually engage.

15. The electrical contact element according to claim 11, wherein the prongs of the fork contact element, contact areas of the fork contact elements, the blade contact elements, or a combination thereof are designed with contour embossing.

16. The electrical I/O module according to claim 2, wherein the blade/fork contact element comprises a blade contact element and a fork contact element, and the I/O module alternately comprises a blade contact element and a fork contact element.

17. The electrical I/O module according to claim 16, wherein the at least one of the blade contact element and/or the fork contact element lies within a base of the I/O module.

18. The electrical contact element according to claim 12, wherein the electrical contact element is manufactured by a punching-bending process from a flexible metal, wherein a first prong of the fork contact element is manufactured in such a manner that no bending process is required after the punching process, and wherein a second prong of the fork contact element is formed after the punching process by a bending process in such a manner that the second prong is bent in a bending direction at a bending angle of approximately 180° in axes parallel to the longitudinal axis of the first prong.

19. The electrical contact element according to claim 18, wherein a blade-fork double contact is manufactured, the blade-fork double contact comprising the blade-fork contact element and an electrical contact element of identical design, which is manufacturable only in a reverse bending direction, such that the blade contact elements and the fork contact elements of the blade-fork contact element and the identical contact element of the combined blade-fork contacts can mutually engage.

20. The electrical contact element according to claim 18, wherein the prongs of the fork contact element, contact areas of the fork contact elements, the blade contact elements, or a combination thereof are designed with contour embossing.

21. An electrical input/output (I/O) module for assembly on a mounting rail, wherein the I/O module is mountable on a side next to another I/O module of a same type on a mounting rail, and the I/O module is contactable with the other I/O module on the side to achieve cross-jumping over a combined blade/fork contact element,
wherein the combined blade/fork contact element is configured to be opened or closed by moving the I/O module both in the axis of the normal of the mounting rail and also in the longitudinal axis of the mounting rail, and
wherein the blade/fork contact element comprises both a fork contact element comprising at least two prongs and a blade contact element, and at least one of the prongs is configured to be usable as a blade contact element.

22. An electrical contact element configured to cross-jump between an electrical input/output (I/O) module for assembly on a mounting rail and another I/O module of a same type on the mounting rail,
wherein the I/O module is mountable on a side next to the other I/O module of on the mounting rail, and the I/O module is contactable with the other I/O module on the side to achieve cross-jumping over a combined blade/fork contact element,
wherein the combined blade/fork contact element is configured to be opened or closed by moving the I/O module both in the axis of the normal of the mounting rail and also in the longitudinal axis of the mounting rail, and
wherein the blade/fork contact element comprises both a fork contact element comprising at least two prongs and a blade contact element, and at least one of the prongs is configured to be usable as a blade contact element.

* * * * *

UNITED STATES PATENT AND TRADEMARK OFFICE
CERTIFICATE OF CORRECTION

| | | |
|---|---|---|
| PATENT NO. | : 9,078,368 B2 | Page 1 of 1 |
| APPLICATION NO. | : 13/594241 | |
| DATED | : July 7, 2015 | |
| INVENTOR(S) | : Matthias Johannes | |

It is certified that error appears in the above-identified patent and that said Letters Patent is hereby corrected as shown below:

ON THE TITLE PAGE

Item (30) Foreign Application Priority Data: "Aug. 24, 2012" should read -- Aug. 24, 2011 --

Signed and Sealed this
Fifteenth Day of March, 2016

Michelle K. Lee
*Director of the United States Patent and Trademark Office*